United States Patent [19]

Junkert et al.

[11] 4,050,309
[45] Sept. 27, 1977

[54] METHOD AND APPARATUS FOR MEASURING TEMPERATURE

[75] Inventors: Kenneth G. Junkert, Manhattan Beach; Henry P. Voznick, Arcadia, both of Calif.

[73] Assignee: William Wahl Corporation, Los Angeles, Calif.

[21] Appl. No.: 520,232

[22] Filed: Nov. 4, 1974

[51] Int. Cl.² .............................................. G01K 7/16
[52] U.S. Cl. ................................................ 73/362 AR
[58] Field of Search ................... 73/362 AR, 362 R; 235/92 MT; 340/347 M, 347 NT

[56] References Cited

U.S. PATENT DOCUMENTS

| | | | |
|---|---|---|---|
| 3,111,662 | 11/1963 | Pierce | 340/347 M |
| 3,477,292 | 11/1969 | Thornton | 73/362 AR |
| 3,620,082 | 11/1971 | Peters | 73/362 AR |
| 3,688,581 | 9/1972 | LeQuernec | 73/362 AR |
| 3,766,782 | 10/1973 | Shimomura | 73/362 AR |
| 3,824,585 | 7/1974 | Meijer | 340/347 NT |
| 3,834,238 | 9/1974 | Mueller et al. | 73/362 AR |
| 3,843,872 | 10/1974 | Shimomura | 73/362 AR X |
| 3,872,726 | 3/1975 | Kauffeld et al. | 73/263 AR |

Primary Examiner—Jerry W. Myracle
Attorney, Agent, or Firm—Causewitz, Carr & Rothenberg

[57] ABSTRACT

Temperature dependent and reference time intervals are simultaneously generated and differentially combined to provide a temperature signal that is employed to generate a probe linearization signal for combination with the temperature signal and digital display. A low resistance platinum probe carries a low current in a timing circuit having a small capacitor charging to a relatively high voltage to provide a high gain for temperature to time conversion circuitry. A continuous real time probe linearization signal is computed for large temperature readings by a double integration circuit having an adjustable readout time for determining the magnitude of the twice integrated temperature signal.

29 Claims, 7 Drawing Figures

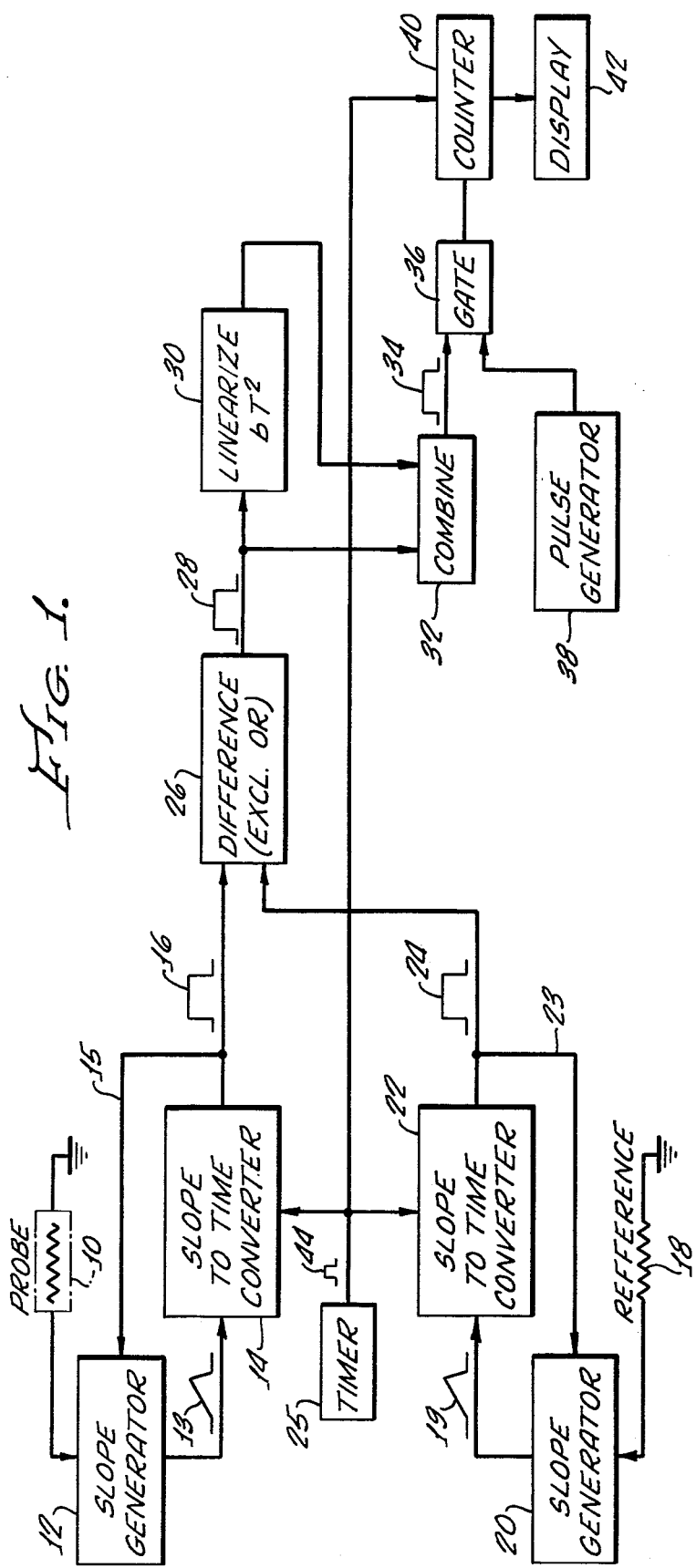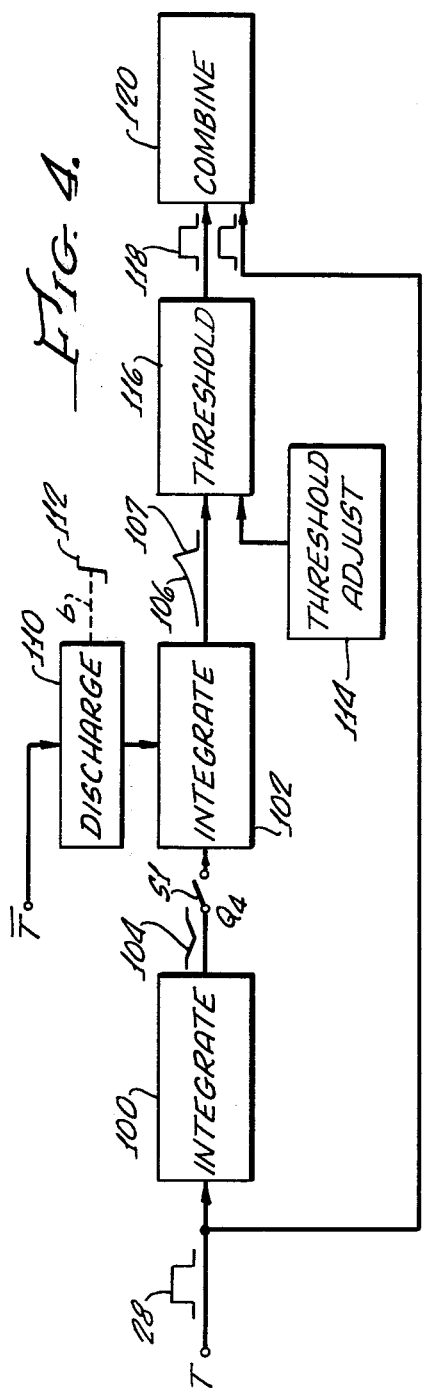

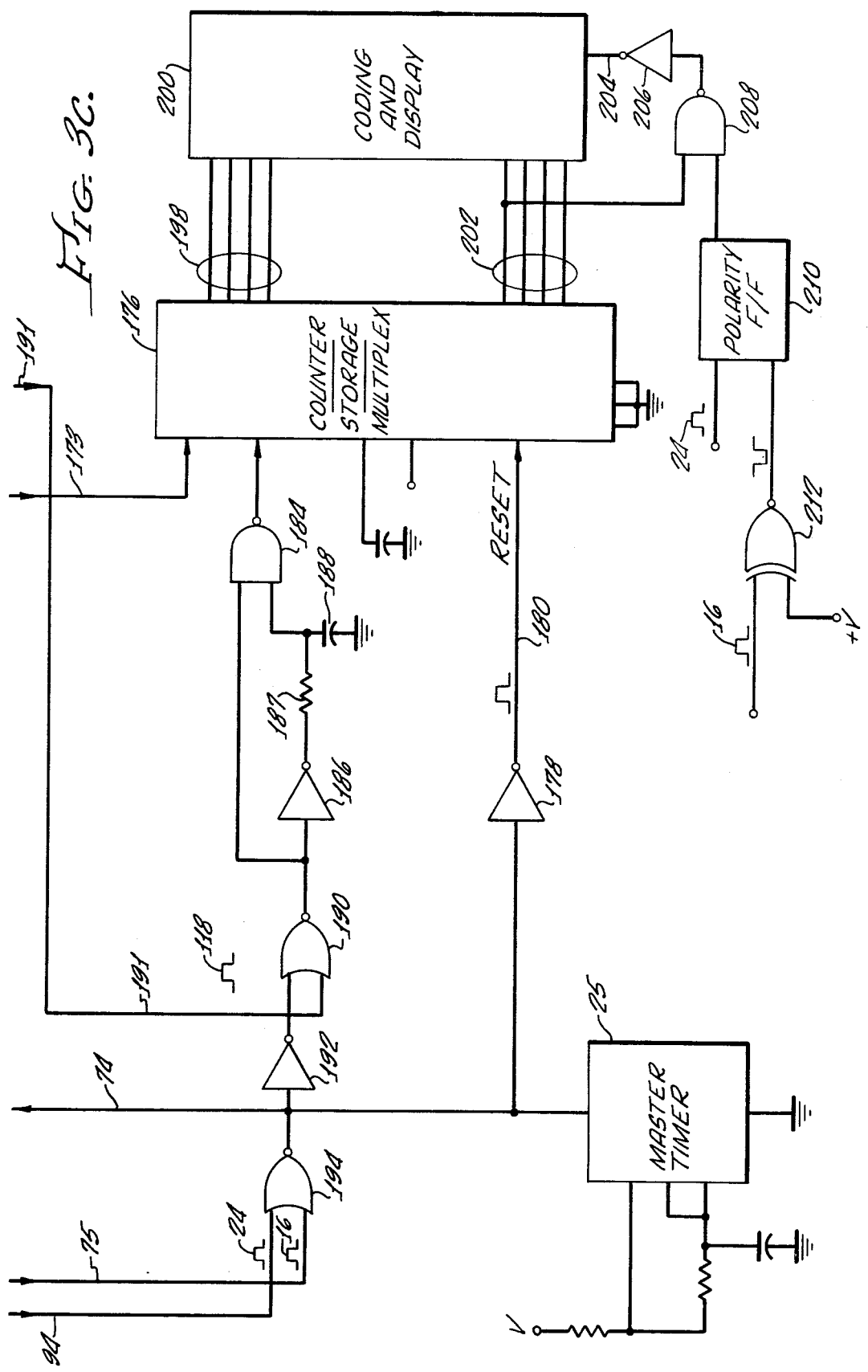

METHOD AND APPARATUS FOR MEASURING TEMPERATURE

BACKGROUND OF THE INVENTION

The present invention relates to electronic measurement and more particularly concerns such measurements that may be readily accommodated to unique characteristics of a measuring probe. Such characteristics include the low gain of low resistance or low output probes and non-linearities of output signals.

Electronic measurement of various conditions, such as temperature, voltage, current, pressure and many others, is commonly accomplished by employing a condition sensitive element, a probe, having an electrical characteristic that varies in accordance with the condition to be measured. Capacitance, magnetic reluctance, inductance, and resistance are among various electrical parameters that are employed in different types of condition sensing probes. Thermocouples and thermistors are often employed in measuring temperature. For temperature measurements over wide ranges, in the order of −50° Centigrade to +500° Centigrade, for example, platinum resistance probes are commonly employed. The resistance of a platinum probe varies with temperature. A common probe has a sensitivity or gain or 0.392 ohms per degree Centigrade, within a useful range of temperatures.

Plantinum probes are available in different resistance values, for different gains. A 5000 ohm platinum probe, although it has a higher gain, is less desirable than a probe of lower resistance (a 100 ohm platinum probe) because the higher resistance requires more time to change resistance upon temperature change and is also more costly. The lower resistance probe is easier and cheaper to manufacture and has a time constant of approximately one to two seconds, whereas the 5000 ohm probe is more difficult to fabricate and has a time constant at least several times as great. However, low resistance platinum probes of the prior art provide such a low output (low gain) that even when employing a bridge input, a large amount of costly amplification is required. Generally, such amplification requires the use of operational amplifiers that necessitate two separate power supplies thereby significantly adding to the bulk and weight of the package.

In the use of a platinum temperature responsive probe, resistance of the probe at the temperture to be measured is compared with the finite resistance that the probe exhibits at a reference temperature, such as 0° Centigrade or Farenheit, for example. An arrangement for making such measurement, employing a dual slope technique, designed by George Zively, is described in a Tech Brief of the National Aeronautics and Space Administration, No. B7210545, entitled a Compact Battery Powered Digital Thermometer. In the Zively apparatus, a capacitor is charged through a probe resistance to a level determined by a sample comparator to thereby generate a time interval for pulses that are applied to cause a reversible counter to count up. After completion of this interval, a reference comparator generates a fixed time interval that causes the counter to count down for a fixed time, resulting in a count retained in the counter that is proportional to the difference between the up and down counting interval.

Even with a high resistance probe, gain in the Zively instrument is not high enough and the apparatus must provide counting pulses at frequencies as high as 15 megahertz for adequate resolution of short time intervals provided by the input circuitry. Such frequencies, (required for adequate gain and resolution) are beyond the capabilities of certain commonly available and inexpensive circuitry such as the complimentary metal oxide semi-conductor (C/MOS) devices. Accordingly, adequate gain and resolution, even where high probe resistances are employed, has not been avaialble.

Furthermore, when using a high resistance probe, a relatively high current must be supplied in order to obtain a useful range of temperature sensitivity. The higher current necessarily descreases the time required to charge the timing capacitor to a given percentage of its full charge and accordingly, the full range measurement interval is concomitantly decreased. The short measurement interval requires high frequency clock pulses for adequate resolution. On the other hand, if a longer measuring time interval is available, one can achieve increased accuracy even with a lower clock frequency and smaller probe resistance.

Although the time interval can be increased by increasing capacitance of the timing circuit, there are physical limits on capacitor size in certain types of application. For example, in a hand-held, completely self-contained measuring instrument, the circuitry is made of miniaturized integrated circuit chips and capacitors sufficiently large to provide adequate time constants have too great a physical size to be compatible with the required packaging constraints.

The patent of Krepak U.S. Pat. No. 3,768,310 describes apparatus for temperature measurement in which a thermistor controls the magnitude of current applied to a one shot multivibrator for determination of the time interval thereof. The thermistor has a greater output than a platinum resistance probe and thus Krepak does not need nor does he suggest any way to provide an increased input gain. The arrangement of Krepak, if it employed a platinum probe would also fall to obtain adequate gain and an adequate time interval for miniaturized equipment.

Neither the thermometer of Zively nor that of Krepak show or suggest compensation for probe non-linearity. Although the resistance of a platinum probe will vary in nearly precisely linear manner with temperature from 0° to about 140° Centigrade, the variation exhibits rapidly increasing non-linearity at higher temperatures. This non-linearity has been recognized, as shown and described in the two patents to Dauphinee et al U.S. Pat. No. 2,933,377 and 3,742,764, and the patent to Shimomura U.S. Pat. No. 3,766,782.. The arrangements of Dauphinee et all employ variable resistance networks including a calibrated tapped resistance element having resistor taps available to provide non-linearity compensation at predetermined discrete intervals and with predetermined magnitudes of compensation. Such an arrangement is an approximation at best, and cannot provide accurate compensation for non-linearities between the discrete intervals that have been specifically selected. The arrangement is analagous to a compensation system in which linearized values of a typical probe resistance are calculated for discrete selected temperatures and stored as linearized or compensated values in a memory, commonly a read only memory. A measured resistance value is then employed as an address to extract from the memory the corresponding linearized resistance value. Such an arrangement is only precise for the intervals selected and requires a relatively large amount of storage. For example, if a temperature range of 500° is to be measured in only one-half degree intervals, one thousand measurements must be stored, each requiring four binary bits. Further, the stored information ar the pre-calculated information, as in Dauphinee et al, is accurate only for one specific probe since probe non-linearities may vary from one probe to another. Thus, employing a read only memory or other type of precalculation as in the Dauphinee et al patent, one must either impose rigid tolerances upon characteristics of the probe resistances to be employed or provide a new linearizing memory for each probe.

The patent to Shimomura employs a complex function generator for correction of non-linearity of temperature measurements, producing an inverse function of a variable and replacing the variable by a time function. The correction is available for one sense of measurement, it cannot be readily included and deleted from the circuit, and it operates throughout the entire range of measurement, not just for higher ranges. This complex corrective circuit must have a wide range of high accuracy.

Accordingly, it is an object of the present invention to provide an improved electronic measuring instrument that substantially eliminates or minimizes the above-identified disadvantages.

SUMMARY OF THE INVENTION

In carrying out principles of the present invention in accordance with a preferred embodiment thereof, probe and reference resistors are employed to control slope or ramp signals which are converted to time signals and then combined to provide a difference signal representing measured temperature. A correction signal based upon non-linearity of the probe resistance is produced in response to the temperature signal and then combined therewith to provide a linearized representation of measured temperature. According to one feature of the invention, a low current through a small probe resistance is employed in a time conversion circuit to provide a selectively controllable high gain. According to another feature of the invention, a correction signal is generated in response to the measured signal by a double integration that uniquely cooperates with the signal measuring circuit to provide a display of the corrected information.

BRIEF DESCRIPTION OF THE DRAWINGS

FIG. 1 is a block diagram of a digital thermometer embodying principles of the present invention;

FIGS. 3a, 3b and 3c collectively comprise a circuit diagram of the apparatus shown in block form in FIG. 1;

FIG. 4 is a block diagram of the linearization circuitry of the apparatus of FIG. 1.

DETAILED DESCRIPTION

Figure 2:
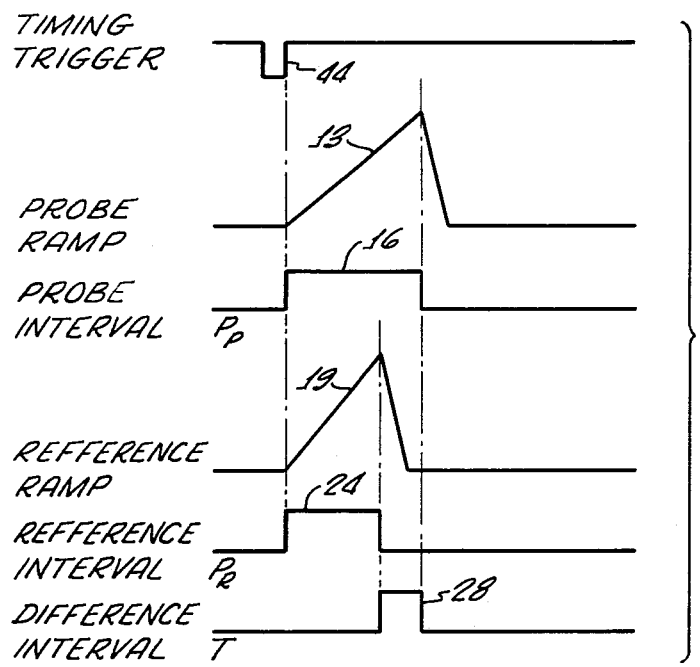
FIG. 2 is a synchrograph showing the relative timing of various signals occurring in a part of the apparatus of FIG. 1.

The present invention and several features employed in the exemplary embodiment of this invention have many applications that will be readily apparent to those skilled in the art, including use in different types of electronic measuring instruments capable of measuring different conditions. Nevertheless, the invention and its features have been initially embodied in a compact miniaturized digital thermometer and accordingly, it is in such an application that the invention will be described. Several aspects of the invention are of greatly increased significance in miniaturized instrumentation, and particularly in such instrumentation that incorporates complimentary metal-oxide-semiconductor (C/MOS) circuitry.

As illustrated in FIG. 1, a platinum resistive probe 10 is connected to control flow of current to a slope generator 12 that produces an electrical ramp signal 13 fed to a slope to time converter 14 wherein it is converted to a time interval $P_p$ in the form of a pulse 16 having a duration directly proportional to the resistance of probe 10. Probe resistor 10 may comprise any one of a number of commonly avaiable temperature variable resistors such as, for example, a platinum resistor having a nominal resistance of 100 ohms. Because of certain gain controlling circuitry to be described below, the low resistance probe may be employed without loss of gain, and using a relatively low voltage supply. The probe resistor 10 has a known or readily determinable fixed resistance $R_o$ at a reference temperature. For example, the probe may be immersed in a bath of ice water and its resistance precisely measured to determine this reference resistance at 0° Centigrade.

Measured resistance of the probe includes a first component directly proportional to its fixed resistance $R_O$ (at a reference temperature) and accordingly, it is necessary to generate a signal representing this fixed resistance. To this end, a reference resistor 18 is employed to generate a current that controls the slope of a second electrical ramp signal 19 produced by a second slope generator 20 and fed to a second slope to time converter 22. Converter 22 produces a reference time interval $P_r$ in the form of a pulse 24, having a duration directly proportional to the magnitude of the reference resistor 18. The input circuits, the reference input and the probe input circuits, the converters 14, 22 thereof, are under control of a master timer 25 whereby both the reference and temperature pulses 24 and 16 are initiated simultaneously. Pulse 24 has a fixed duration, whereas pulse 16 has a duration that varies with sensed temperatures. Differentially combining the probe resistance with the reference resistance provides an indication of the magnitude of the sensed temperature relative to the reference temperature, the latter being determined by the value of the reference resistor 18. This differential combining is performed in a difference circuit, which may be an exclusive OR circuit as described hereinafter, designated 26 in FIG. 1, to provide a time interval T in the form of a pulse 28 that has a duration directly proportional to the measured probe resistance (unlinearized) with respect to the reference.

The exemplary embodiment of the present invention is designed for use in a temperature range that varies from about −50° C to +500° C. For a variation of about 140° C, relative to the reference temperature (0° C), the resistance of a plantinum probe varies nearly linearly with temperaure, departing from such linearity only in amounts (about 0.27%) that are too small to be of significance in measurement instruments having an accuracy as great as 1%. Nevertheless, above about 140° from the reference temperature, significant non-linearity exists. Thus, the resistance $R_p$ of the probe may be expressed as:

$$R_p = R_O + R_O aT - R_O b T^2$$

where $R_p$ is the resistance of the probe at a temperature T, $R_O$ is the resistance of the probe at a reference temperature (such as 0° for example), a is the (constant) probe gain, and b is a constant termed the gain modifier. Actually, the equation for probe resistance $R_p$ includes additional higher order terms, but these higher order terms have a negligible effect upon temperature measurements made with instruments of this type, and accordingly, may be neglected.

The non-linear term $bT^2$ actually causes the probe resistance to be less than it would be if it varied in a precisely linear fashion with temperature since the negative sign in the above equation reflects the fact that the constant b is negative for platinum (although it is positive for other metals). Accordingly, addition of a quantity proportional to $bT^2$ to the quantity representing the measured probe resistance will provide a precise (except for higher order terms that are dropped in computing a linearization quantity and linearlized representation of temperature.

A linearization quantity proportional to $bT^2$ is computed in a circuit 30 (FIG. 1) in response to the measured temperature interval 28 and added to the latter in a combining circuit 32 which produces a time interval, represented as a pulse 34, that has a duration precisely proportional to measured temperature, being proportional to the linearized resistance of the probe. The linearized pulse 34 is employed as a time window to enable a gate 36 which receives clock pulses from a pulse generator 38 to be fed through the gate to a counter 40. The counter counts a number of the fixed repetition rate clock pulses from pulse generator 38, reaching a count directly proportional to the duration of pulse 34. This count is displayed in a digital 42 or otherwise employed for computation, recordation or display.

Operation of the temperature sensing portion of the apparatus of FIG. 1 is illustrated in the sychrograph of FIG. 2, which shows that each timing trigger 44 from timer 25 initiates a probe ramp 13 and a reference ramp 19, having slopes respectively proportional to resistance of probe resistor 10 and reference resistor 18. Converters 14 and 22 respectively compare the ramp signals 13 and 19 with a predetermined voltage level, initiating the respective pulses 16 and 24 upon occurrence of the trigger 44 and terminating the pulses when the respective ramp signals attain a predetermined voltage.

The ramp signals are terminated by a signal fed back from the converters via lines 15 and 23 to the slope generators 12 and 20, respectively. Difference circuit 26 provides the pulse 28 having a duration proportional to the difference in durations of the probe interval 16 and reference interval 24.

Figure 3A:
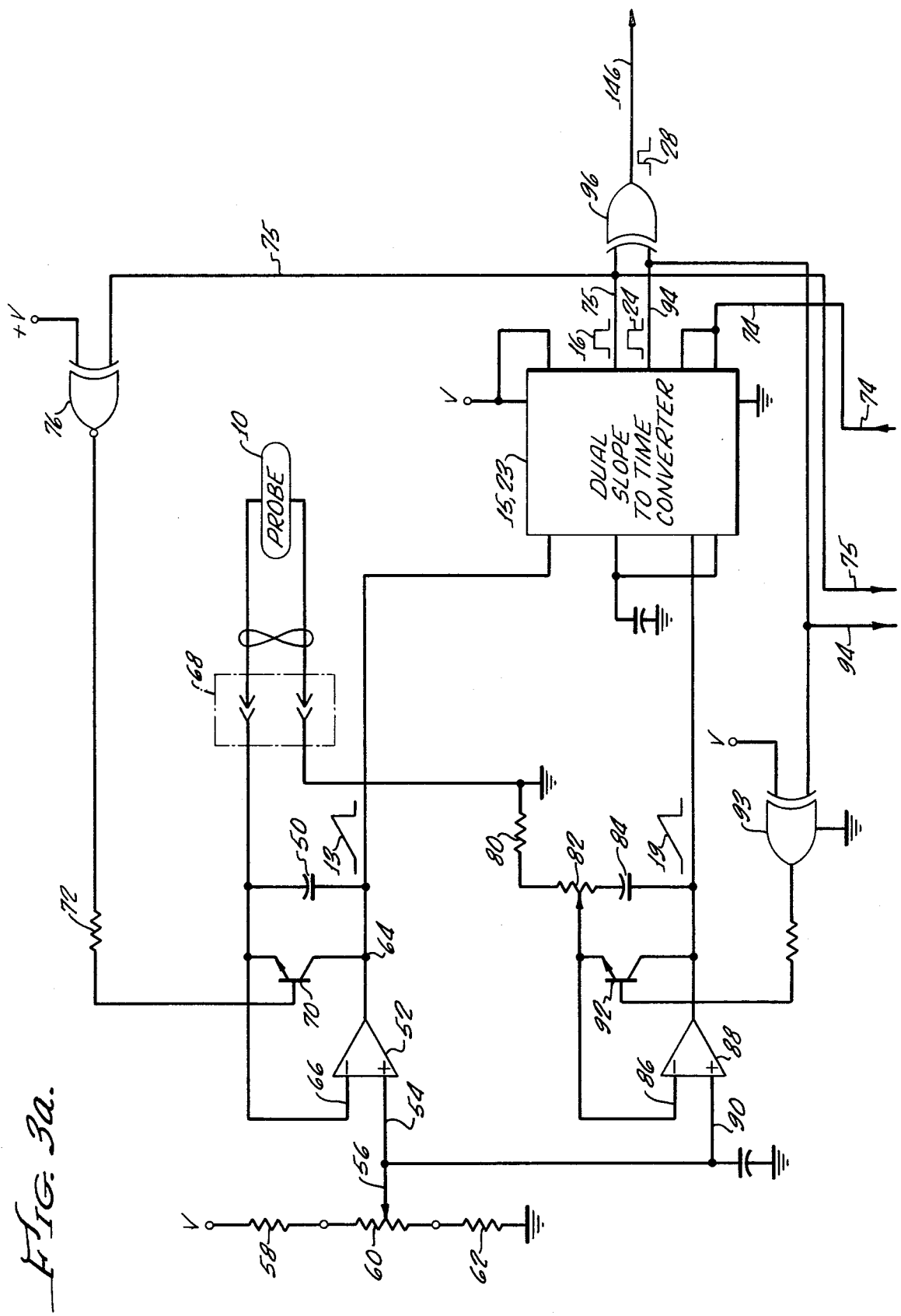
Figure 3B:
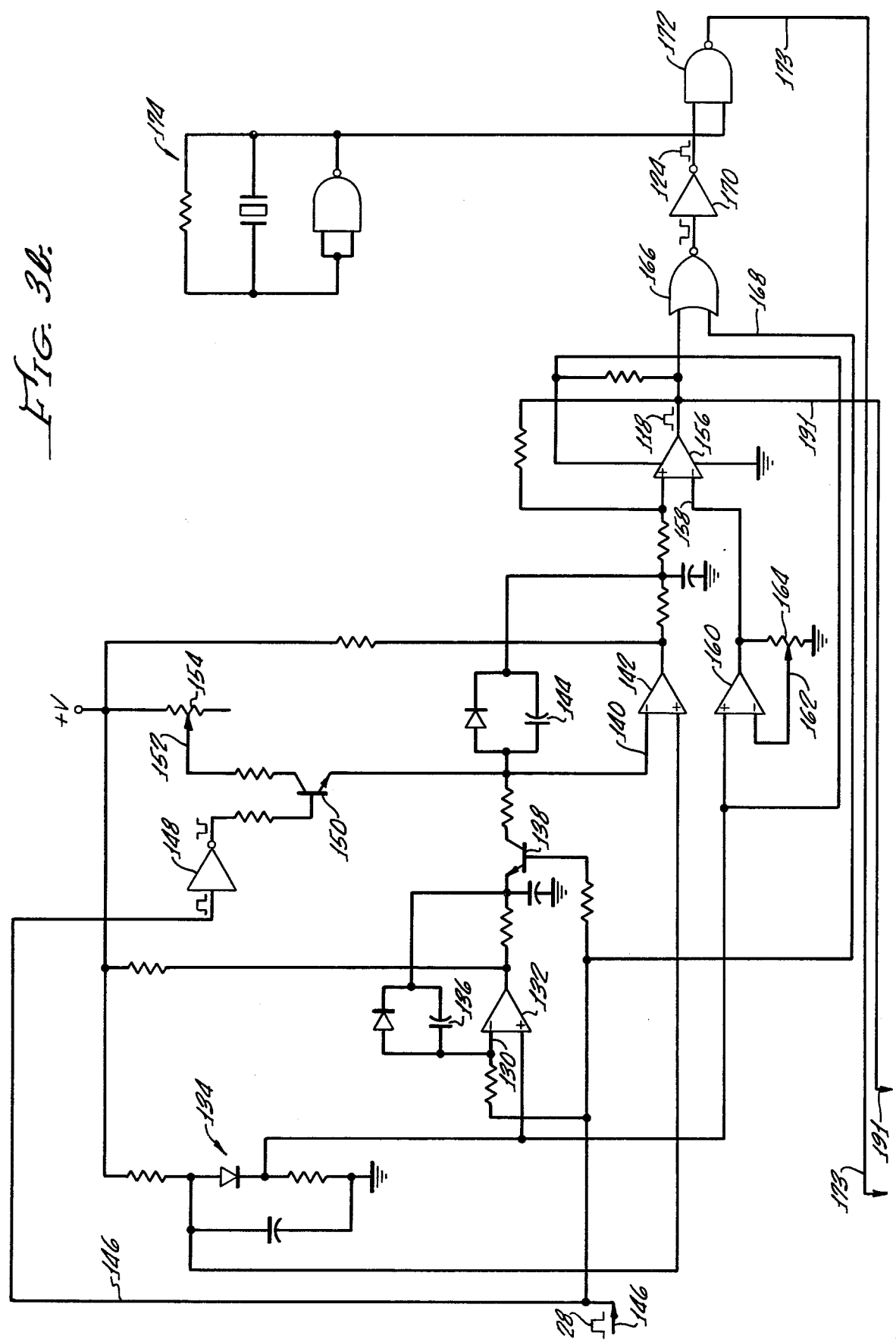

Detailed circuitry of the apparatus of FIG. 1 is shown in FIGS. 3a, 3b and 3c. These three sheets of drawings illustrate the exemplary circuit when FIGS. 3a and 3b are placed side by side with FIG. 3b to the right and FIG. 3c is placed beneath FIGS. 3a and 3b, substantially evenly spaced from left and right ends of FIGS. 3a and 3b respectively. Probe resistor 10 is connected as part of a unique resistance capacitance timing circuit that provides a readily controllable high gain with a relatively low resistance probe, employing a low current and thus, a small slope and long time interval. The low current is provided by maintaining a relatively low voltage across the probe resistance. Nevertheless, the ramp 13 generated by the timing circuit can readily rise to a significantly higher value, a value many times that maintained across the controlling probe resistor.

The probe timing circuit (FIG. 3a) includes a capacitor 50 connected in the feedback loop of an operational amplifier 52, that has one of its input terminals, positive terminal 54, for example, connected to a selectively variable potential at the wiper arm 56 of a group of resistors 58, 60, 62, series connected between ground and a positive supply V. In an exemplary embodiment a single voltage source providing five volts positive supply, is employed for the entire instrument, for energization of the probe and converters, and for energization of all of the other circuits. The voltage source is preferably regulated by circuitry (not shown) well known in the art. Capacitor 50 is connected between the output of the amplifier, at point 64, and the other of the amplifier input terminals, the opposite (negative) polarity input terminal 66. Probe resistor 10 is connected between ground and input terminal 66. The probe is detachably connected in the circuit by means of a conventional jack 68.

Connected across the capacitor to effect periodic discharge thereof, is an NPN switching transistor 70, having its collector coupled with the amplifier output, at point 64, it emitter coupled with the input terminal 66, and its base connected via a resistor 72 to receive a trigger signal indicating completion of the comparison of the ramp with the fixed potential.

Resistor 58 of the series connected group of resistors is considerably larger than resistors 60 and 62 so that, with a five volt supply at source V, the potential at the input terminal 54 of amplifier 52 is in the order of 90 millivolts in an exemplary embodiment. With transistor 70 conducting, there is a voltage drop across the transistor of approximately 50 millivolts and the voltage at the amplifier output terminal 64 will thus be approximately 140 millivolts. The high gain of the amplifier, a gain in the order of 100 thousand, operates to maintain the voltage at the opposite polarity input terminal 66 substantially at the same value (within limits related to amplifier gain) as the voltage at the terminal 54. The voltage at terminal 66 accordingly remains at the relatively low value (90 millivolts in the embodiment employed herein for purposes of exposition), wherefor the voltage across the probe resistor 10 is 90 millivolts.

The output of amplifier 52 (and the voltage at the corresponding side of capacitor 50) is fed to one input of a dual slope to time converter 15, 23. The converter 15, 23 contains a pair of identical circuits, each of which compares the input voltage with a predetermined voltage level such as a level equal to two thirds of the voltage source V for example. In the exemplary embodiment, the converters 15, 23 comprise a dual timer, Model No. NE556A, manufactured by Signetics, of Sunnyvale, California, and the operational amplifiers are Model No. LM342D or LM3242, manufactured by National Semiconductor Corp., of Santa Clara, California. The master timer 25 (FIG. 3c) produces the circuit trigger pulses at a rate of three pulses per second in the exemplary embodiment. The trigger pulses are fed via a line 74 to initiate operation of the converters 15, 23. Upon receipt of a trigger pulse on line 74, the output of the converter 15 on line 75, for example, rises, initiating the probe pulse 16. This high signal on line 75 is fed through an exclusive or circuit 76, connected to operate as an inverter, and than via resistor 72 to cut off the normally conducting transistor 70 for the duration of pulse 16. When probe pulse 16 is terminated, transistor 70 is again caused to conduct.

Upon occurrence of a trigger pulse from the timer 25 and initiation of the time interval of the converter 15, transistor 70 is cut off and capacitor 50 begins to charge. The potential at the side of the capacitor connected to probe resistor 10 and amplifier input terminal 66 is held to a low fixed value by the feedback loop of the amplifier which operates to maintain the value of the potential at terminal 66 substantially equal to the potential at terminal 54 (within the limits of the amplifier gain). Capacitor 50 is connected in this feedback loop and receives the amplifier output current. This current charges the capacitor and the potential at amplifier output terminal 64 rises to produce the probe ramp signal 13. This ramp signal increases in a liner manner because the output current of the operational amplifier is a linear function of time. Ramp 13 continues to rise until it reaches a level determined by converter 15, at which time the converter output pulse 16 drops to initiate conduction of transistor 70, rapidly discharging capacitor 50.

The described timing circuit maintains a precisely controlled but relatively low voltage across the resistor of the RC timing circuit but nevertheless enables the capacitor of the circuit to charge to a voltage that is many times greater than the voltage across the resistor. Thus, the capacitor may charge to a value of 3.3 volts (as determined by converter 15) whereas the voltage across the resistor remains at about 90 millivolts. With a low voltage across the resistor 10 of the RC timing circuit, current flow through the resistor is proportionately low. Therefore, the charging current to capacitor 50 of the timing circuit is also low and the slope of the ramp 13 (the time rate of change of voltage across capacitor 50) is likewise small. Accordingly, a relatively long time interval is generated for a given amount of resistance and gain of the circuit is increased.

Significantly, the described input circuit allows use of a small resistor and also allows use of a small capacitor. The small resistor is desired for low cost and faster response of the probe. The small capacitor may be required because of space limitations. Nevertheless, a high gain input is provided because a small but precise current is caused to flow through the resistor.

The voltage across the resistor 10, and accordingly the time interval of the probe pulse 16, is directly controlled by the voltage that is maintained at amplifier input terminal 54. This voltage is readily adjusted by manipulation of wiper arm 56. Thus gain of the circuit may be readily adjusted. Moving the wiper arm 56 to double the potential on terminal 54, for example, will double the charging current and accordingly halve the duration of pulse 16. Conversely, decreasing the potential at input terminal 54 will decrease the magnitude of charging current to thereby proportionately increase the duration of the pulse. It is a simple matter to convert from Cetrigrade readout to Farenheit readout, requiring merely a gain change of 1.8, which is achieved by decreasing the voltage level at terminal 54 by a factor of 1.8.

The slope generator circuit for the reference resistor is identical to that for the probe resistor, except that an adustable reference resistance, comprised of fixed resistor 80 and variable resistor 82, is connected between ground and the common junction of a timing capacitor 84 and one input terminal 86 of a second operational amplifier 88. The other polarity input of amplifier 88, input 90, is connected to the wiper arm 56 and accordingly to the same potential as is input terminal 54 of the amplifier 52. A second transistor 92 is connected across the capacitor 84 to effect discharge thereof when the transistor base receives a signal from line 94 of the output of the second slope to time converter 32. This signal occurs upon termination of reference pulse 24 which is fed to transistor 92 via an exclusive OR circuit 93, connected to operate as an inverter. The slope generating and time converting circuit for the reference works in exactly the same manner as does the corresponding circuitry for the probe. It produces the reference pulse 24, initiated at the same time as the probe pulse 16, but having a duration fixed by the value of the reference resistance. The latter is selected by adjustment of the wiper arm of variable resistor 82.

The two pulses 16 and 24 are fed to an exclusive OR circuit 96 which provides a positive output pulse 28 (a temperature pulse) that occurs only while one of the inputs to the exclusive OR circuit, but not the other, is present. In other words, according to the conventional operation of the exclusive OR, the output is true or high when and only when one of its inputs is high and the other is low. Thus, the exclusive OR circuit operates as a chronological difference circuit, as evident from FIG. 2, to produce a pulse having a duration proportional to the difference between the two input pulses thereto.

The temperature pulse 28 produced at the output of the exclusive OR circuit 96 may be used to provide a digital display of the temperature represented by its duration. Nevertheless, because of the non-linearity of probe resistance with temperatures at higher temperatures, the temperature pulse 28 must be corrected before it is employed for display or other purposes. To this end, the temperature pulse is employed as an input to a linearization computing circuit that computes a quantity proportional to $bT^2$ as defined above, in the manner broadly illustrated in FIG. 4.

Referring to the block diagram of the linearization of FIG. 4, temperature pulse 28 is fed to a first integrating circuit 100 and thence, via a first switch $S_1$ to a second integrating circuit 102. Each integrator, as is well known, stores a value proportional to the duration of the input thereto. Switch $S_1$ is closed upon initiation of the temperature pulse 28 and opened upon termination of the pulse. The output of integrator 100 is a negative going ramp 104 (FIG. 5) which is fed to the second integrator 102 for the duration of the temperature pulse 28. The output of the second integrator 102 takes the upwardly curving shape indicated at 106 in FIG. 5, which is the first integral of curve 104 and the second integral of pulse 28. The output of the second integrator rises to a level proportional to $T^2$. Then this integrator is discharged to cause its output to drop in a linear fashion and for a time proportional to the gain modifying factor $b$. This discharge is indicated by the linear negative going portion 107 of curve 106. Integrator 102 is caused to discharge under control of a discharge circuit 110 that provides discharging current that is adjustably controlled by an adjusting knob 112.

The level to which the output of integrator 102 is allowed to drop is controlled by a threshold adjusting the circuit 114 which provides a first input to a threshhold circuit 116. The output of integrator 102 is provided as a second input to the circuit 116. Threshold circuit 116 accordingly provides an output pulse 118 (FIG. 5) which is initiated (at point 109) when the output of the second integrator goes above the threshhold (dotted line 11) determined by adjusting circuit 114. Pulse 118 terminates when the second integrator output drops below this threshhold level, at point 113. Thus, there is generated a correction or linearization time interval which is, in effect, initiated at point 108, the point at which the second integrator begins its discharge (on termination of the temperature signal 28) and which correction interval terminates at point 113, when the second integrator output returns to the threshhold level. The threshhold circuit 116 controls the generation of the linearization signal, pulse 118, so that linearization is effected only when the sensed temperature exceeds a selected value.

Correction time pulse 118 is combined with the temperature pulse 28 in a circuit 120, which in effect, adds to the duration of pulse 28 the time subsequent to termination of pulse 28 during which the correction time pulse 118 remains high. This circuit 120 adds a correction interval 122 (FIG. 5) to the temperature pulse 28 (e.g., extends the duration of pulse 28) to produce the corrected temperature interval 124. It may be noted that the correction interval 122 does not exist as a pulse of any of the circuits but is only a time interval proportional to the amount of linearization or correction signal. It is the corrected temperature interval pulse 124 that is employed for precise representation of measured temperature.

FIG. 3b shows the linearization circuit. Temperature pulse 28 is fed to one of the inputs 130 of an integrating operational amplifier 132 having the other polarity input thereof connected to $+V$ via a circuit 134 that provides a precise potential for this amplifier input. The output of integrating operational amlifier 132 is connected to the input 130 thereof by a feedback circuit including an integrating capacitor 136, and is also feed via a switching transistor 138 to one input terminal 140 of a second integrating amplifier 142. A precise potential is established on the second input of amplifier 142 by connection to the source of potential $+V$ via circuit 134. Integrating amplifier 144.

The temperature pulse 28 is fed to the base of transistor switch 138 to cause this transistor to conduct while pulse 28 is high and thereby connect the output of th first integrating amplifier 132 to input terminal 140 of the second integrating amplifier 142. This connection is disabled upon termination of pulse 28 which cuts off the transistor switch 138.

Figure 5:
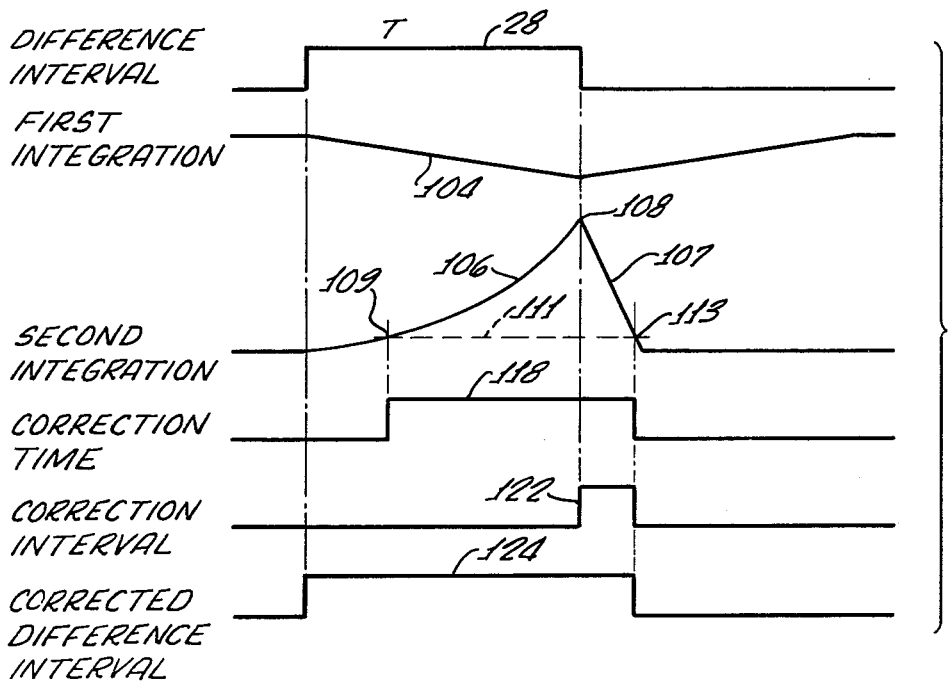
FIG. 5 is a synchrograph illustrating waveforms of the linearization circuitry.

During the occurrence of pulse 28 the integrators operate and the feedback capacitors 136 and 144 store the increasing values of the amplifier outputs, as indicatd by curves 104, 106 of FIG. 5. Pulse 28 is fed via line 146 and via an inverter 148 to the base of a constant current generating circuit including a transistor 150. Transistor 150 has its emitter connected to the input terminal 140 of amplifier 142 and to one side of the feedback capacitor 144, and has its collector connected to the movable tap 152 of a variable resistor 154 that is connected to the $+V$. During the time that pulse 28 is high, transistor 150 is cut off and capacitor 144 of the second integrating amplifier 142 will charge along the curve 106 as indicated in FIG. 5. Upon termination of pulse 28 transistor 150 conducts to provide a constant current of a magnitude determined by the adjustment of potentiometer arm 152. This current linearly discharges capacitor 144 over a time interval that is proportional to the constant current provided by transistor 150, which in turn is porportional to the adjusted voltage provided from wiper arm 152. The latter is adjusted to provide the quantity $bT^2$.

Less costly linearization circuitry may be employed because the linearization of the described apparatus is provided only at larger temperature readings. Components and circuits of higher precision (and higher cost) are required to maintain a suitable accuracy at low ranges of a wide range instrument. Greater precision is required at lower ranges of temperature readings to maintain the same percentage of error. Nevertheless, non-linearity of the probe resistance is not significant below about 140° C. Therefore, the generation of the linearization or compensatory signal, or its combination with the temperature signal, pulse 28, is disabled for temperatures below a selected value, such as 140° C. Thus, the linearization circuitry requires considerably less accuracy and may be less costly (since an error of 1°, for example, is within a 1% accuracy tolerance for measurements above 100° but may not be acceptable for measurements below 100°).

For selective application of linearization correction at higher temperatures, the output of the second integrator 142 is fed to an amplifier 156 connected to operate as a comparator. Amplifier 156 compares a first input from integrator 142 with a second input of an input terminal 158 that is provided from a threshold adjusting amplifier 160. The latter has one of its inputs connected to $+V$ via the voltage stabilizing circuit 134 and the other of its inputs connected to a variable potential established at the wiper arm 162 of a potentiometer 164, whereby the threshhold level of threshhold comparator 156 may be readily selected. Comparator 156 provides an output only when the measured temperature exceeds a value determined by the selected threshhold. Threshhold comparator 156 provides the output pulse 118 which is initiated during the occurrence of the temperature pulse 28, and which terminates at a time after the termination of pulse 28, when the output of the second integrating amplifier 142 reaches the point 113. The arrangement is such that the second integrator stores a signal proportional to $T^2$ and this signal is converted to a time interval that is proportional to the stored signal multiplied by a selected constant.

The correction time pulse 118 is fed as a first input to a NOR circuit 166 which has as its other input the temperature pulse 28, provided from exclusive OR circuit 96 via a line 168. It is in this NOR circuit 166 that the linearization correction is combined with the temperature signal to provide the inverted corrected temperature signal 124.

The corrected temperature signal 124 is fed via an inverter 170 to the first input of a NAND circuit 172. A crystal oscillator 174 produces a train of fixed repetition rate pulses at a suitably high frequency, such as one megacycle for example, which pulses are fed as the second input to NAND gate 172. Gate 172 is enabled by the corrected temperature difference signal 124, as inverted by inverter 170, and thus at the output of the gate there appears a number of clock pulses precisely proportional to the duration of the combined corrected temperature pulse 124. These pulses are fed via a line 173 to the counting input of a counter and storage device 176 (FIG. 3c) that is periodically reset by trigger pulses fed from the master timer 25 via an inverter 178 to a counter reset line 180. The counter and storage circuit 176 may be a Hughes four stage counter and storage, with multiplexer drive, Model No. HCTK4010 including four counters and buffer storage. After a measurement has been made, the counter contents are shifted to the buffer storage and the next measurement of the three measurements per second may be made. Thus, the counters are reset upon occurrence of each trigger pulse on line 180. The counter input gate 172 (FIG. 3b) is enabled for a time proportional to the corrected temperature and the counters are caused to count to a value proportional to such time. At the end of each measurement, a transfer pulse is fed to the counter to cause the contents of the counter to be fed to the counter storage. This transfer pulse is provided from the output of a NAND gate 184 having a first input from an inverter 186 via an RC integrating circuit 187, 188. A second input of NAND gate 184 and the input to inverter 186 are provided in common from the output of a NOR gate 190. A first input to NOR gate 190 is the correction time pulse 118 provided at the output of threshhold comparator 156 via line 191 (FIG. 3b). A second input of gate 190 is provided via an inverter 192 from the output of a NOR gate 194 having inputs from lines 75 and 94 respectively representing the pulses 16 and 24.

The arrangement for transfer from the counters to storage is such that the first input to NAND gate 184 (from the output of NOR gate 190) is low until the end of both the pulses 16 and 24 (from timers 15 and 23) and, also, the end of correction time pulse 118 from comparator 156. Similarly, the second input to gate 184 is high but will remain high after the termination of the low pulse to the other input of gate 184 because of the storage action of capacitor 188. Accordingly, at the end of the measurement time, which is at the end of the pulse 118 from comparator 156, NAND gate 184 has one input uniquely high and its output then goes high to trigger the transfer from the counters to the storage.

Specific details of the arrangement for counting, storing and displaying the digital measurement may be varied to provide many different arrangements known to those skilled in the art. Details of such counting, coding and display form no part of this invention. Briefly, the storage of the counter 176 is fed via a plurality of output lines 198 to coding and display apparatus 200 having a plurality of display digits which are sequentially energized under control of a plurality of sequentially activated digit multiplexing lines 202 from the counter device 176.

Polarity of the measurment is provided to the coding and display device 200 via a line 204 from an inverter 206 that receives the output of a NAND gate 208. The first input to the NAND gate is provided from one of the multiplexing lines 202 to synchronize the negative sign of the display. In the exemplary arrangement, the absence of a negative sign on the digital decimal display indicates a positive reading and the presentation of a negative sign indicates a negative reading. Line 204 is energized to display the negative sign for a negative reading by means of a polarity flip-flop 210. The inverse of the probe signal pulse 16 is provided as a clock input to the flip-flop and the reference signal, pulse 24, is fed to its set input. The inverted probe signal is provided from the output of an exclusive OR gate 212 having one input connected to a fixed potential +V to thereby act as an inverter. The second input of gate 212 is the probe pulse 16. If the reference pulse 24 drops while the probe pulse 16 is high, the measured temperature is positive (e.g., higher than the reference temperature). In such a case, flip-flop 210 receives the clock input from the probe pulse while its set input is low. Accordingly, the output of the flip-flop remains low and no polarity signal is fed via the line 204 to the coding and display apparatus 210. If the probe pulse 16 falls before the reference pulse 24, the measured temperature is negative (less than the reference temperature), the set input of the polarity flip-flop is high when the flip-flop receives its clock and accordingly, the flip-flop is toggled to provide a negative sign signal on line 204.

In the exemplary embodiment disclosed herein, linearization is only employed for positive temperature measurement. Non-linearities are of little significance within about 140° of reference temperature. Accordingly, since the exemplary apparatus is not intended for use with measurements more than 50° and below the reference (0° C), no non-linearity compensation is needed for negative temperatures. Nevertheless, if such negative temperature non-linearity compensation is desired, one need only employ the polarity flip-flop 210 to control conventional direction circuitry for combining the linearization interval with the measured interval in the proper sense.

Although the present invention has been disclosed in an embodiment specifically arranged for use with a platinum resistive probe, such probe may be readily replaced by a conventional thermistor. The thermistor has a faster response time and is cheaper than the platinum probe, although its sensitive temperature range is more limited. The thermistor provides an output voltage that is sufficiently high to enable use of an input operational amplifier, such as amplifiers of 52 and 88, of less precision. The thermistor has a higher resistance, about 2000 ohms, and further, generally requires no linearization, since many thermistors are linearized when manufactured. Accordingly, the linearization circuitry of the described embodiment need not be used with such linearized thermistors. The thermistor has a negative temperature coefficient, and when used as the input probe in the circuit of FIGS. 3a, 3b and 3c, is connected in the circuit in the same manner as is the platinum probe resistor. When the negative temperature coefficient thermistor is used, the opposite output (opposite to that shown in FIG. 3c) of polairty flip-flop 210 is employed to drive the sign segment of the display 200. Also, reference resistors 80, 82 are adjusted or changed to the higher value of resistance of the thermistor at the reference temperature.

There have been described methods and apparatus for measuring temperature, for providing high gain input sensing and for providing improved linearization which collectively enable the manufacture of efficient, accurate, wide range, rapid acting, sensing instruments in a package of low cost and small size.

The foregoing detailed description is to be clearly understood as given by way of illustration and example only, the spirit and scope of this invention being limited solely by the appended claims.

What is claimed is:

1. A temperature measuring instrument comprising first and second resistors,
first and second slope generators connected with said first and second resistors respectively, for generating first and second ramp signals, each having a slope determined by a corresponding one of said resistors,
first and second slope to time converters responsive respectively to said first and second ramp signals for generating first and second time intervals respectively indicative of the slopes of said first and second ramp signals, timing means for simultaneously repetitively triggering said first and second converters, means responsive to said first and second converters for repetitively actuating said first and second slope generators in synchronism with each other, means responsive to both said converters for combining the time intervals produced thereby to generate a measurement signal representative of the difference between said first and second time intervals, and means for indicating the duration of said measurement signal.

2. The instrument of claim 1 including means responsive to said measurement signal for generating a linearization signal having a duration proportional to the square of the duration of said measurement signal, and means for combining said measurement signal with said linearization signal to provide a linearized measurement signal having a duration equal to the total duration of said measurement signal and said linearization signal, said means for indicating the duration of said measurement signal comprising means for indicating the duration of said linearized measurement signal.

3. The instrument of claim 2 including means for selecting a value of said measurement signal below which no linearization signal is combined with said measurement signal.

4. The instrument of claim 2 wherein said means for generating a linearization signal comprises a first integrator having an input responsive to said measurement signal and having an output, a second integrator having an input responsive to said first integrator output, and having an output, a threshhold circuit having an input from the output of said second integrator and having a threshhold adjustment control, said linearization signal being provided at the output of said threshhold circuit.

5. The instrument of claim 4 wherein said second integrator includes an integrating capacitor, a constant current circuit for discharging said integrating capacitor, further including a first switch interconnecting the input of said second integrator with the output of said first integrator, a second switch for interconnecting said constant current circuit with said capacitor, means responsive to initiation of said measurement signal for closing said first switch to connect the output of said first integrator to the input of said second integrator, and means responsive to termination of said measurement signal for actuating said second switch to effect discharge of said capacitor.

6. The apparatus of claim 1 wherein said first slope generator comprises an operational amplifier having an output terminal and first and second input terminals, a capacitor connected in a feedback loop between said output terminal and said first input terminal, said first resistor having one side connected in common to one side of said capacitor and to said first input terminal, and means for establishing a selected potential at said second input terminal, said means for repetitively actuating said slope generators comprising means responsive to said first slope to time converter for periodically discharging said capacitor, whereby said operational amplifier will control the potential at said first input terminal thereof in response to the potential at said second input terminal thereof to thereby maintain a relatively low potential across said first resistor, and whereby said amplifier output terminal provides charging current to said capacitor and first resistor at a relatively low fixed value to thereby provide a high input gain for the circuit, said means for establishing a fixed potential at said second input terminal comprising means for establishing a potential that is considerably less than the potential to which said capacitor may be charged from the output terminal of said amplifier.

7. In a thermometer having a resistive sensing element of which the resistance varies with temperature, a gain controlling input circuit comprising an amplifier having first and second opposite polarity inputs and an output, a source of potential connected to said first input, a capacitor connected in a feedback path between said output and said second input, means for connecting said resistive sensing element between a second potential and the side of the capacitor connected to said second input to maintain a fixed potential across said resistive sensing element, and means for discharging said capacitor at a predetermined voltage.

8. The thermometer of claim 7 including means for measuring the time required for said capacitor to charge to said predetermined voltage to provide a measured signal indicative of temperature sensed by said element.

9. The thermometer of claim 8 including means for combining said measured signal with a reference signal to provide a temperature signal indicative of value of sensed temperature relative to a reference temperature.

10. The thermometer of claim 8 including means for linearizing said measured signal.

11. The thermometer of claim 8 wherein the resistance of said sensing element includes a non-linear gain characteristic that varies with temperature in a non-linear fashion, and including means for combining with said temperature signal a compensatory signal representing said non-linear gain characteristic.

12. The thermometer of claim 11 wherein said last mentioned means includes means for disabling the combining of said compensatory signal for values of said temperature signal less than a preselected value.

13. The thermometer of claim 11 wherein said temperature signal comprises a pulse having a duration representative of sensed temperature and wherein said means for generating said compensatory signal comprises a first integrator responsive to said pulse, a second integrator responsive to said first integrator and having a storage capacitor connected to be charged thereby, and means for discharging said storage capacitor upon termination of said pulse.

14. A thermometer comprising a sensing element having a characteristic that varies as a non-linear function of temperature, means responsive to said sensing element for generating an electrical temperature signal having a duration that varies in linear relation with said characteristic of said sensing element, means responsive to said electrical temperature signal for generating a linearization signal having a duration that varies as a non-linear function of said electrical signal, and means for combining said linearization signal with said electrical temperature signal to provide an output electrical signal representing temperature to which said sensing device is subjected and compensated for the temperature non-linearity of said sensing element.

15. The thermometer of claim 14 wherein said sensing element comprises a temperature senstive resistor having a resistance R that varies in accordance with the equation $R = R_0(1 + aT + bT^2)$, where $R_0$ is the resistance of said element at a predetermined temperature, T is temperature, a is a constant representing the linear gain characteristics of said element, and b is a constant representing a second order non-linear gain characteristic of said element, wherein said means for generating an electrical temperature signal comprises means for generating a signal representing the resistance R, and wherein said means for generating a linearization signal comprises means responsive to said electrical temperature signal for generating said linearization signal as a separate signal proportional to the quantity $bT^2$.

16. A thermometer comprising
a sensing element having a characteristic that varies as a non-linear function of temperature,
means responsive to said sensing element for generating an electrical temperature signal having a parameter that varies in linear relation with said characteristic of said sensing element,
means responsive to said electrical temperature signal for generating an analog linearization signal that varies continuously as a non-linear function of said electrical signal,
means for combining said linearization signal with said electrical temperature signal to provide an output electrical signal representing temperature to which said sensing device is subjected and compensated for the temperature non-linearity of said sensing element, and means for disabling generation of said linearization signal for values of said temperature signal within a selected range of values relative to a reference.

17. A thermometer comprising
a sensing element having a characteristic that varies as a non-linear function of temperature,
means response to said sensing element for generating an electrical temperature signal having a duration that varies in linear relation with said characteristic of said sensing element,
means responsive to said electrical temperature signal for generating a linearization signal having a duration that varies as a non-linear function of said electrical signal,
means for combining said linearization signal with said electrical temperature signal to provide an output electrical signal representing temperature to which said sensing device is subjected and compensated for the temperature non-linearity of said sensing element,
said means for generating said electrical temperature signal comprising means for generating an electrical pulse having a duration representative of the quantity $R_OaT + R_ObT^2$, where $R_O$ is the resistance of said element at a predetermined temperature, T is temperature, a is a constant representing the linear gain characteristics of said element, and b is a constant representing a second order non-linear gain characteristic of said element, said means for generating said linearization signal comprising means responsive to said pulse for generating a compensatory pulse having a duration representing the quantity $R_ObT^2$, said means for combining comprising means for generating an output signal having a duration equal to the combined durations of said temperature pulse and said compensatory pulse.

18. A linear thermometer comprising a resistive sensing element having a resistance R that varies in accordance with the equation $R = R_O(1 + aT + bT^2)$ where $R_O$ is the resistance of said element at a predetermined temperature, T is temperature, a is a constant representing the linear gain characteristics of said element, and b is a constant representing a second order non-linear gain characteristic of said element, means responsive to said sensing element for generating a first temperature signal having a duration representing the difference between $R_O$ and the quantity $R_o + aT + R_ObT^2$,
means responsive to said first temperature signal for generating a second temperature signal having a duration representing the quantity $R_ObT^2$, and means for combining said first and second temperature signals to provide a linearized temperature signal.

19. A linear thermometer comprising
a resistive sensing element having a resistance R that varies in accordance with the equation $R = R_O(1 + T + bT^2)$ where $r_O$ the resistance of said element at a predetermined temperature, T is temperature, a is a constant representing the linear gain characteristics of said element, and b is a constant representing a second order non-linear gain characteristic of said element,
means responsive to said sensing element for generating a first temperature signal representing the difference between $R_O$ and the quantity $R_o + R_OaT + R_ObT2$,
means responsive to said first temperature signal for generating a second temperature signal representing the quantity $R_ObT^2$,
means for combining said first and second temperature signals to provide a linearized temperature signal, and
including means for initiating generation of said second temperature signal in response to attainment of a predetermined minimum value by said first temperature signal.

20. A linear thermometer comprising
a resistive sensing element having a resistance R that varies in accordance with the equation $R = R_0(1 + aT + bT^2)$ where $R_O$ is the resistance of said element at a predetermined temperature, T is temperature, a is a constant representing the linear gain characteristics of said element, and b is a constant representing a second order non-linear gain characteristics of said element,
means responsive to said sensing element for generating a first temperature signal representing the difference between $R_O$ and the quantity $R_O + R_OaT + R_ObT^2$,
means responsive to said first temperature signal for generating a second temperature signal representing the quantity $R_ObT^2$, and
means for combining said first and second temperature signals to provide a linearized temperature signal, said means for generating said second temperature signal comprising first integrating means for integrating said first temperature signal and providing a first integrated output, and second integrating means for integrating said first integrated output to provide a double integrated output.

21. The thermometer of claim 20 wherein said second integrating means comprises a storage device for storing a signal having a value proportional to said double integrated output, and means for discharging the contents of said storage device to a predetermined level.

22. The thermometer of claim 21 wherein said last mentioned means comprises means for discharging said storage device at a selectively controlled rate.

23. The thermometer of claim 20 wherein said first temperature signal comprises a temperature pulse having a duration proportional to the difference between the quantities $R_O$ and $R_OaT + R_ObT^2$, and having a leading edge and a trailing edge, and wherein said second integrating means includes a storage capacitor that is charged to a value representing the quantity $T^2$, including means responsive to the trailing edge of said first-mentioned temperature pulse for discharging said capacitor to a predetermined level, and means for generating a compensatory pulse having a trailing edge that coincides with the discharge of said capacitor to a predetermined voltage level.

24. The method of measuring temperature comprising
generating a temperature signal including a non-linear component that varies in a known non-linear relation to temperature,
generating a linearization signal that varies as said non-linear component,
combining said temperature and linearization signals, indicating said combined signals for temperatures that differ from a reference temperature by more than a preselected amount, and
indicating said temperature signal without said linearization signal for temperatures differ from said reference by less than said preselected amounts.

25. The method of claim 24 wherein temperature to be measured may vary over a range of several hundred degrees from a reference temperature, wherein said generating a temperature signal is effected with a relative greater precision, and wherein said generating a linearization signal is effected with a relative lesser precision.

26. The method of claim 24 wherein said linearization signal is combined with said temperature signal only when said temperature signal exceeds a predetermined value.

27. The method of claim 24 wherein said temperature signal has a duration representative of temperature and wherein said combining is effected by varying said duration by an amount representative of said non-linear component.

28. A linear thermometer comprising a sensing element having a characteristic that includes a first component that varies linearly with temperature and a second component that varies non-linearly with temperature,
means for generating a temperature signal having a duration representing the difference between a reference and said sensing element characteristic,
means responsive to said temperature signal for generating a linearization signal having a duration representing said second component, and
means for combining said temperature and linearization signals.

29. A temperature measuring instrument comprising
first and second resistors,
first and second slope generating circuits connected with said first and second resistors, respectively, for generating first and second ramp signals each having a slope determined by a corresponding one of said resistors,
first and second slope-to-time converters responsive respectively to said first and second ramp signals for generating first and second time intervals respectively indicative of the slopes of said first and second ramp signals,
means responsive to both said converters for combining the time intervals produced thereby to generate a measurement signal representative of the difference between said first and second time intervals,
means for indicating the duration of said measurement signal,
at least one of said slope generating circuits comprising
a capacitor,
said first resistor connected between one side of said capacitor and a point of fixed potential,
an amplifier having an output and first and second opposite polarity inputs, and having a feedback loop connecting the output of the amplifier with said first input,
means for connecting said capacitor in said feedback loop,
means for supplying a selected potential to said second amplifier input, and
means for discharging said capacitor.

* * * * *

UNITED STATES PATENT AND TRADEMARK OFFICE
CERTIFICATE OF CORRECTION

PATENT NO. : 4,050,309            Page 1 of 3

DATED : September 27, 1977

INVENTOR(S) : Kenneth Junkert

It is certified that error appears in the above-identified patent and that said Letters Patent are hereby corrected as shown below:

Col. 1, line 26: Change "or", second occurrence, to ---of---;

Col. 1, line 29: Change "Plantinum" to ---Platinum---;

Col. 2, line 8: Change "avaialble" to ---available---;

Col. 4, line 15: Change "avaiable" to ---available---;

Col. 4, line 59: Change "plantinum" to ---platinum---;

Col. 4, line 65: Change "resistance" to ---voltage---;

Col. 4, line 60: Change "temperaure" to ---temperature---;

Col. 5, line 35: After "digital" and before "42" insert ---display---;

Col. 6, line 66: Change "or" to ---OR---;

Col. 7, line 16: Change "liner" to ---linear---;

Col. 8, line 4: After "effect" and before "discharge" insert ---periodic---;

Col. 8, line 63: Before "circuit" delete "the";

UNITED STATES PATENT AND TRADEMARK OFFICE
CERTIFICATE OF CORRECTION

PATENT NO. : 4,050,309
DATED : September 27, 1977
INVENTOR(S) : Kenneth Junkert

It is certified that error appears in the above-identified patent and that said Letters Patent are hereby corrected as shown below:

Col. 9, line 34: Change "amlifier" to ---amplifier---;

Col. 9, line 36: Change "feed" to ---fed---;

Col. 9, line 41: After "amplifier" delete "144" and insert the following: ---142 is provided with a feedback circuit including a capacitor 144.---;

Col. 9, line 44: Change "th" to ---the---;

Col. 9, line 52: Change "dicatd" to ---dicated---;

Col. 12, line 14: After "50°" and before "below" delete "and";

Col. 12, line 42: Change "polairty" to ---polarity---;

Col. 16, line 18: Insert a small ---a--- before the first occurrence of "T";

Col. 16, line 18: Change "$r_o$" to ---$R_o$---;

UNITED STATES PATENT OFFICE
CERTIFICATE OF CORRECTION

Patent No. 4,050,309　　　　　Dated September 27, 1977

Inventor(s) Kenneth Junkert

It is certified that error appears in the above-identified patent and that said Letters Patent are hereby corrected as shown below:

Col. 16, line 27, Change "$R_o$", second occurrence, to -- $R_0$ --.

Signed and Sealed this

Seventh Day of March 1978

[SEAL]

Attest:

RUTH C. MASON  
Attesting Officer

LUTRELLE F. PARKER  
Acting Commissioner of Patents and Trademarks